(12) United States Patent
Davidson et al.

(10) Patent No.: US 6,903,575 B1
(45) Date of Patent: Jun. 7, 2005

(54) SCALABLE DEVICE ARCHITECTURE FOR HIGH-SPEED INTERFACES

(75) Inventors: Allan T. Davidson, San Jose, CA (US); Satwant Singh, Fremont, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 95 days.

(21) Appl. No.: 10/425,863

(22) Filed: Apr. 28, 2003

(51) Int. Cl.[7] .................. H03K 19/173; H01L 25/00
(52) U.S. Cl. .................... 326/47; 326/41; 326/38
(58) Field of Search ............... 326/38, 39, 40, 326/41, 47

(56) References Cited

U.S. PATENT DOCUMENTS 6,426,649 B1 * 7/2002 Fu et al. ................ 326/41
6,483,343 B1 * 11/2002 Faith et al. ............. 326/40
6,608,500 B1   8/2003 Lacey et al.
6,674,303 B1   1/2004 Morse et al.

OTHER PUBLICATIONS

U.S. Appl. No. 10/425,862, filed Apr. 28, 2003, entitled "Programmable And Fixed Logic Circuitry For High-Speed Interfaces".

* cited by examiner

*Primary Examiner*—Daniel Chang
(74) *Attorney, Agent, or Firm*—MacPherson Kwok Chen & Heid LLP; Greg J. Michelson

(57) ABSTRACT

An architecture is disclosed to provide high-speed input/output interface capabilities for programmable devices. One or more configurable input/output circuits are situated between the input/output drivers and the programmable core circuitry of the programmable device. The input/output circuits are optimized for the high-speed requirements of the input/output interface standards, with each input/output circuit configurable to support numerous, different input/output interface standards. The programmable core circuitry may be utilized to support the lower-speed requirements of the input/output interface standards.

20 Claims, 12 Drawing Sheets

| Standard | Number of lanes | Required macros(2) | Device A 2 macros (type 1) | Device B 3 macros (type 1) | Device C 4 macros (type 1) | Device D 5 macros (type 1) | Device E 6 macros (type 1) |
|---|---|---|---|---|---|---|---|
| XAUI | 4 | 1 | 2 | 3 | 4 | 5 | 6 |
| InfiniBand | 1 | <1 | 8 | 12 | 16 | 20 | 24 |
|  | 4 | 1 | 2 | 3 | 4 | 5 | 6 |
|  | 12 | 3 |  | 1(1) | 1(1) | 1(1) | 2(1) |
| VSR SONET | 4 | 1 | 2 | 3 | 4 | 5 | 6 |
| VSR SONET (8b/10b) | 12 | 3 |  | 1(1) | 1(1) | 1(1) | 2(1) |
| 2X Fibre Channel | 1 | <1 | 8 | 12 | 16 | 20 | 24 |
| Fibre Channel | 1 | <1 | 8 | 12 | 16 | 20 | 24 |
| Gbit Ethernet | 1 | <1 | 8 | 12 | 16 | 20 | 24 |

(1) Supported by cascading the type 1 hard-macros
(2) Type 1 hard-macros include both TX and RX functions

FIG. 8

| Standard | Data bus width | Required macros(3) | Device A 4 macros (type 2) | Device B 8 macros (type 2) | Device C 12 macros (type 2) | Device D 16 macros (type 2) | Device E 20 macros (type 2) | Device F 24 macros (type 2) |
|---|---|---|---|---|---|---|---|---|
| RapidIO | 8 | 1TX + 1RX | 2 | 4 | 6 | 8 | 10 | 12 |
|  | 16 | 2TX + 2RX | 1(1) | 2(1) | 3(1) | 4(1) | 5(1) | 6(1) |
| HyperTransport | 2 | 1TX + 1RX | 2 | 4 | 6 | 8 | 10 | 12 |
|  | 4 | 1TX + 1RX | 2 | 4 | 6 | 8 | 10 | 12 |
|  | 8 | 1TX + 1RX | 2 | 4 | 6 | 8 | 10 | 12 |
|  | 16 | 2TX + 2RX | 1(1) | 2(1) | 3(1) | 4(1) | 5(1) | 6(1) |
|  | 32 | 4TX + 4RX |  | 1(1) | 1(1) | 2(1) | 2(1) | 3(1) |
| SPI4-P2, POS-PHY4 | 16 | 3TX + 3RX |  | 1(1) | 2(1) | 2(1) | 3(1) | 4(1) |
| SPI4-P1, Flexbus4 | 64 | 5TX + 5RX |  |  | 1(1) | 1(1) | 2(1) | 2(1) |
|  | 4x16 | 8TX + 8RX |  |  |  | 1(1) | 1(1) | 1(1) |
| SFI-4 | 16 | 2TX + 2RX | 1(1) | 2(1) | 3(1) | 4(1) | 5(1) | 6(1) |
|  | 8 | 1TX + 1RX | 2 | 4 | 6 | 8 | 10 | 12 |
| Utopia-4 | 16 | 2TX + 2RX | 1(1) | 2(1) | 3(1) | 4(1) | 5(1) | 6(1) |
|  | 32 | 4TX + 4RX |  | 1(1) | 1(1) | 2(1) | 2(1) | 3(1) |
| XGMII | 32 | 2TX + 2RX | 1(1) | 2(1) | 3(1) | 4(1) | 5(1) | 6(1) |
|  | 32 | 2TX + 2RX | 1(1) | 2(1) | 3(1) | 4(1) | 5(1) | 6(1) |
| CSIX | 64 | 4TX + 4RX |  | 1(1) | 1(1) | 2(1) | 2(1) | 3(1) |
|  | 96 | 6TX + 6RX |  |  | 1(1) | 1(1) | 1(1) | 2(1) |
|  | 128 | 8TX + 8RX |  |  |  | 1(1) | 1(1) | 1(1) |
| QDR Memory Interface: | user defined | multiple | yes(2) | yes(2) | yes(2) | yes(2) | yes(2) | yes(2) |
| DDR Memory Interface: | user defined | multiple | yes(2) | yes(2) | yes(2) | yes(2) | yes(2) | yes(2) |

(1) Supported by cascading the type 2 hard-macros
(2) Cascading of type 2 hard-macros may or may not be necessary depending on width of memory interface
(3) Type 2 hard-macros are either configured as transmitter (TX) or receiver (RX)

FIG. 9

| Source-Synchronous Standards | Electrical Signaling | Clocking Style | Receiver Clock Shift | Transmitter Clock Shift | Receiver Gearbox | Transmitter Gearbox |
|---|---|---|---|---|---|---|
| RapidIO | LVDS | DDR | 90 degrees | - | yes | yes |
| HyperTransport | HyperTransport | DDR | - | 90 degrees | yes | yes |
| SPI4-P2, POS-PHY4 | LVDS | DDR | 90 degrees | - | yes | yes |
| SPI4-P1, Flexbus4 | HSTL | SDR | - | 180 degrees | - | - |
| SFI-4 | LVDS | DDR | 90 degrees | - | yes | yes |
| SFI-4 | LVDS | SDR | 180 degrees | - | yes | yes |
| Utopia-4 | LVDS | SDR | - | 90 degrees | yes | yes |
| XGMII | HSTL | DDR | - | 90 degrees | yes | yes |
| CSIX | HSTL | SDR | - | 90 degrees | - | - |
| QDR memory interface | SSTL | DDR | 90 degrees | 90 degrees | - | - |
| DDR memory interface | SSTL | DDR | 90 degrees | 90 degrees | - | - |

FIG. 11

| SerDes Based Standards | Electrical Signaling | Sync Character Detect | 8b/10b Encoder/ Decoder | Clock Tolerance Compensation | Channel Alignment | Deskew State Machines | Synchronization State Machine | Transmit and Receive State Machines |
|---|---|---|---|---|---|---|---|---|
| XAUI | XAUI | yes | yes | yes | yes | yes | yes | yes |
| InfiniBand | InfiniBand | yes | yes | yes | yes | yes | yes | – |
| VSR SONET (scrambled) | LVDS | yes | – | – | yes | yes | – | – |
| VSR SONET (8b/10b) | LVDS | yes | yes | – | yes | – | yes | – |
| 2X Fibre Channel | LVPECL | yes | yes | yes | – | – | yes | – |
| Fibre Channel | LVPECL | yes | yes | yes | – | – | yes | – |
| Gbit Ethernet | LVPECL | yes | yes | yes | – | – | yes | – |

SCALABLE DEVICE ARCHITECTURE FOR HIGH-SPEED INTERFACES

TECHNICAL FIELD

The present invention relates generally to electrical devices and, more particularly, to a device architecture for a high-speed interface.

BACKGROUND

There has been a growing proliferation of high-speed input/output interface standards (i.e., agreed principles and protocols) directed towards various applications within the electronics industry. These standards generally address chip-to-chip interfaces, board-to-board interfaces, and box-to-box interfaces for a wide range of emerging applications, such as data packet processing, data bus bridges, and high-speed memory interfacing, to name but a few.

Certain programmable devices (or chips), such as programmable logic devices (e.g., including complex programmable logic devices and field programmable gate arrays) can potentially handle a wide range of input/output interface standards because of their flexible programmable circuitry. Specifically, the core logic of the programmable device may be programmed to accommodate the desired input/output standards by performing the necessary logic. In contrast, other types of devices that have fixed-functions or non-scalable interfaces (e.g., a peripheral component interconnect (PCI) interface) are typically limited to the set of input/output standards that the circuitry was specifically designed (i.e., hard-wired) to accommodate.

A drawback of programmable devices is that their performance is generally limited due to the nature of their flexible, programmable circuitry. For example, a signal propagating through programmable circuitry will typically take longer than through circuitry specifically designed for the desired function or application. Consequently, programmable devices are more suited to medium-frequency logic and interface applications than the emerging high-speed input/output interface applications. As a result, there is a need for systems and methods to address the high-speed input/output interface for programmable devices.

SUMMARY

An architecture is disclosed herein for devices (e.g., programmable logic devices) requiring a high-speed input/output interface. For example, one technique in accordance with an embodiment of the present invention is to recognize and extract the commonality between various input/output interface standards and to implement this in a combination of programmable and fixed logic circuitry. The common, high-speed part of each input/output interface standard (e.g., the method of interfacing to the input/output drivers) is extracted and committed to a fixed circuit (e.g., a configurable hard-macro circuit). The application-specific, lower-speed part of each input/output interface standard is extracted and implemented in the programmable core logic of the device. Consequently, devices (e.g., programmable logic devices) incorporating the systems and methods disclosed herein can address the high-speed input/output interface applications, which are generally not feasible for traditional programmable devices.

More specifically, in accordance with one embodiment of the present invention, a programmable device includes a plurality of programmable input/output drivers; a plurality of hard macros coupled to the programmable input/output drivers, with each of the hard macros configurable to support more than one input/output interface standard; and programmable core logic coupled to the hard macros.

In accordance with another embodiment of the present invention, a method for supporting a plurality of input/output interface standards with a programmable device, the method includes supporting a plurality of electrical signaling levels; determining the common high-speed requirements of the input/output interface standards; and mapping the common high-speed requirements of the input/output interface standards to hard macros on the programmable device, with each of the hard macros configurable to implement more than one input/output interface standard.

In accordance with another embodiment of the present invention, a method of implementing a plurality of input/output interface standards on a programmable device, the method includes determining common characteristics for a plurality of input/output interface standards; providing configurable hard-macro circuits to implement the common characteristics, with each of the hard-macro circuits adaptable to support more than one of the input/output interface standards; and providing programmable core circuits for implementing the remaining requirements for the input/output interface standards in the programmable logic device In accordance with another embodiment of the present invention, a programmable device includes a plurality of input/output drivers; a plurality of hard macros coupled to the input/output drivers, with each of the hard macros adapted to support more than one input/output interface standard; and programmable core logic coupled to the hard macros, wherein common functions for the input/output interface standards are supported by the hard macros and specific functions required for the input/output interface standards are supported by the programmable core logic.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

FIGS. 8 and 9 illustrate exemplary interface standards supported by a device in accordance with an embodiment of the present invention.

FIG. 11 illustrates an exemplary list of common features for source-synchronous interface standards in accordance with an embodiment of the present invention.

FIG. 12 illustrates an exemplary list of common features for clock and data recovery-based interface standards in accordance with an embodiment of the present invention.

The preferred embodiments of the present invention and their advantages are best understood by referring to the

DETAILED DESCRIPTION

Figure 1:
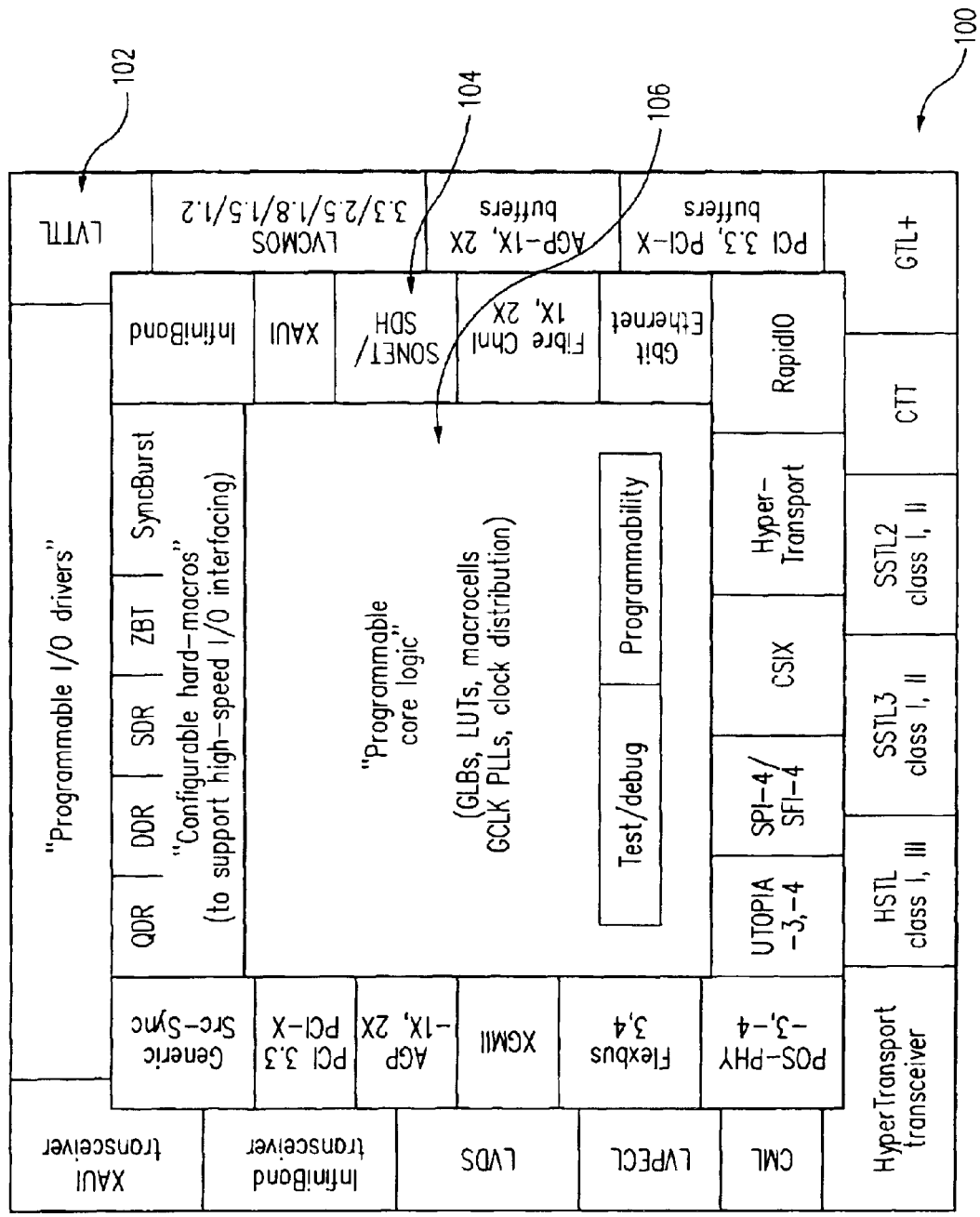
FIG. 1 shows a block diagram illustrating a device having an architecture in-accordance with an embodiment of the present invention.

FIG. 1 shows a block diagram illustrating a device 100 having an architecture in accordance with an embodiment of the present invention. Device 100 represents any type of electrical device (e.g., an integrated circuit or chip) that requires a high-speed input/output interface. For example, device 100 is a programmable logic device, such as a complex programmable logic device or a field programmable gate array. Device 100 includes input/output drivers 102, hard-macro circuits 104, and core circuits 106.

Input/output drivers 102 can support a wide range of electrical signaling levels required for the standard interfaces. For example, input/output drivers 102 may be programmable input/output drivers positioned as an outer ring of circuitry, as shown on the block diagram of device 100. Exemplary types of electrical signaling levels that may be supported by input/output drivers 102 are listed (e.g., such as LVCMOS, SSTL, HSTL, and LVDS) on the outer ring in FIG. 1. However, the electrical signaling levels that are listed are not limiting and many other types of signaling levels may be supported.

Core circuits 106 includes programmable core logic, such as for example, logic blocks, lookup tables, macro cells, and/or other types of programmable circuitry that may be found on conventional programmable logic devices. Core circuits 106 may also include various other circuitry, such as clock distribution circuits, global clock phase-locked loops, test or debug circuitry, and circuits to aid in the programming of the core logic. The programmable core logic of core circuits 106 is generally very flexible in terms of its functions, but is limited in performance (e.g., speed) due to this flexibility.

The performance available from input/output drivers 102 is typically much higher than that available from the programmable core logic of core circuits 106. However, the full performance of input/output drivers 102 has been traditionally unused in conventional programmable devices, because the performance of the programmable device is limited by the slowest section, which is generally the programmable core logic.

In accordance with an embodiment of the present invention, situated along with core circuits 106 and input/output drivers 102 are hard-macro circuits 104. Hard-macro circuits 104 (also referred to herein as input/output circuits) are permanent logic or circuits that are scalable and optimized in terms of performance to operate at the clock rates required by the high-speed input/output interface standards and protocols. For example, hard-macro circuits 104 may be configurable to some extent to accommodate a range of interface standards and may be positioned, as shown in FIG. 1, as a central ring of circuitry around core circuits 106 and within the outer ring of input/output drivers 102.

Exemplary types of interface standards that may be supported by hard-macro circuits 104 are listed (e.g., XAUI, CSIX, XGMII, and RapidIO) on the central ring in FIG. 1. However, the interface standards that are listed are not limiting and many other types of interface standards may be supported.

Hard-macro circuits 104 use permanent (i.e., hard-wired) logic designed for the high-speed input/output interface standards, while maintaining some programmability or configurability to provide for a wide range of interface standards. Because hard-macro circuits 104 use permanent logic, they support much higher performance levels than are available from equivalent logic implemented in the programmable core of core circuits 106.

In general, hard-macro circuits 104 provide the necessary circuitry or interface between input/output drivers 102 and core circuits 106 for the high-speed input/output interface standards to be supported. The connection between hard-macro circuits 104 and input/output drivers 102 may be matched to the performance required to support the high-speed interface standards and protocols. The connection between hard-macro circuits 104 and the programmable core logic of core circuits 106 may be matched to the performance available from the programmable core logic.

The lower speed logic (e.g., interface controllers, FIFO buffers, and state machines) that does not require the performance of hard-macro circuits 104 may be mapped into the programmable core logic of core circuits 106 to complete the logic requirements of the high-speed input/output interface. Alternatively, when the interface requires only a low-speed input/output interface (e.g., a low-speed system-synchronous standard) such that the bit-rate at the pins of device 100 is low enough to allow a direct transfer of data to and from core circuits 106, then hard-macro circuits 104 can be bypassed.

Hard-macro circuits 104 may be viewed as a configurable system input/output interface that supports various high-speed input/output interface standards (e.g., packet based interface standards and memory interfaces). Hard-macro circuits 104 adjust for the difference in the bit-rate of data at the pins of device 100 and the maximum operating frequency of the core logic within device 100. In one sense for example, hard-macro circuits 104 function as a "digital gearbox," which slows down and widens the data (e.g., increases the number of parallel bits of data) as it enters device 100 and speeds up and narrows the data (e.g., decreases the number of parallel bits of data) as it exits device 100. Hard-macro circuits 104 also can generate and receive the source-synchronous clocks and perform clock and data recovery for those interface standards that require this function.

The architecture of device 100 is scalable for various device sizes. Also, multiple hard-macro circuits 104 can be cascaded to implement wider interfaces than would be feasible with a single macro. Consequently, a family of devices can be created, with the number of hard-macro circuits 104 included on each device within the family chosen based on the size of the device and the intended applications.

For example, FIGS. 2 through 7 show corresponding devices 200 through 700 that illustrate the scalability of a device architecture in accordance with an embodiment of the present invention. Devices 200 through 700 may be part of or represent a device family. Note that in FIGS. 2 through 7 that a center portion of devices 200 through 700 has not been shown for simplicity of the figures and that actually the center portion would be filled-in by continuing the columns through the center portion by the appropriate type of circuitry suggested by the blocks bordering at the top and bottom of the center portion in each figure.

Device 200 (FIG. 2) includes 32 rows and 16 columns of logic blocks 202 [which are separately referenced as $202_{(i,j)}$, with "i" representing the row number and "j" representing the column number], four columns of memory 204 [which are separately referenced as 204(1) through 204(4)], and 6 hard-macro circuits 206 [which are separately referenced as 206(1) through 206(6)].

Logic blocks 202 may represent any type of generic programmable logic block (such as discussed above for core circuits 106 of FIG. 1) and memory 204 may represent any type of memory that is desired to be situated on device 200. Hard-macro circuits 206 are logic that is cascadable and optimized to operate at the necessary clock rates required to accommodate the high-speed input/output interface standards, as discussed above for hard-macro circuits 104 of FIG. 1.

Hard-macro circuits 206 may represent one or more types of circuits to provide an interface for one or more groups of high-speed interface standards. For example, hard-macro circuits 206(1) and 206(2) may represent one type (i.e., type 1), of circuit specifically for one group of high-speed interface standards and hard-macro circuits 206(3) through 206 (6) may represent a second type (i.e., type 2) of circuit specifically for another group of high-speed interface standards.

Hard-macro circuits 104 (FIG. 1) and hard-macro circuits 206 (FIGS. 2 through 7) allow corresponding devices 100 through 700 to support the emerging packet-based high-bandwidth interface standards and also support interfacing to high-speed synchronous memory devices (e.g., DDR and QDR interfaces). The type 1 hard macros (also referred to herein as SerDes/PCS macros) may, for example, have dedicated high-speed pads and support clock and data recovery circuit (CDR)-based system input/output interface standards, while the type 2 hard macros (also referred to herein as source-synchronous macros or source-sync macros) may, for example, have high-bandwidth input/output pads (e.g., high-bandwidth application specific integrated circuit input/output pads) and support source-synchronous, system-synchronous, and high-speed memory input/output interface standards.

Further details regarding various types of hard-macro circuits and exemplary circuitry can be found in U.S. patent application Ser. No. 10/425,862 entitled "Programmable and Fixed Logic Circuitry for High-Speed Interfaces" and filed on Apr. 28, 2003, which is incorporated herein by reference in its entirety.

Referring briefly to FIGS. 8 and 9, exemplary interface standards are listed and the number of input/output interfaces that are supported by a device in accordance with an embodiment of the present invention. Specifically, exemplary interface standards that can be supported by devices of various sizes, such as within a device family, are shown in FIG. 8 for type 1 hard-macro circuits and FIG. 9 for type 2 hard-macro circuits.

Figure 2:
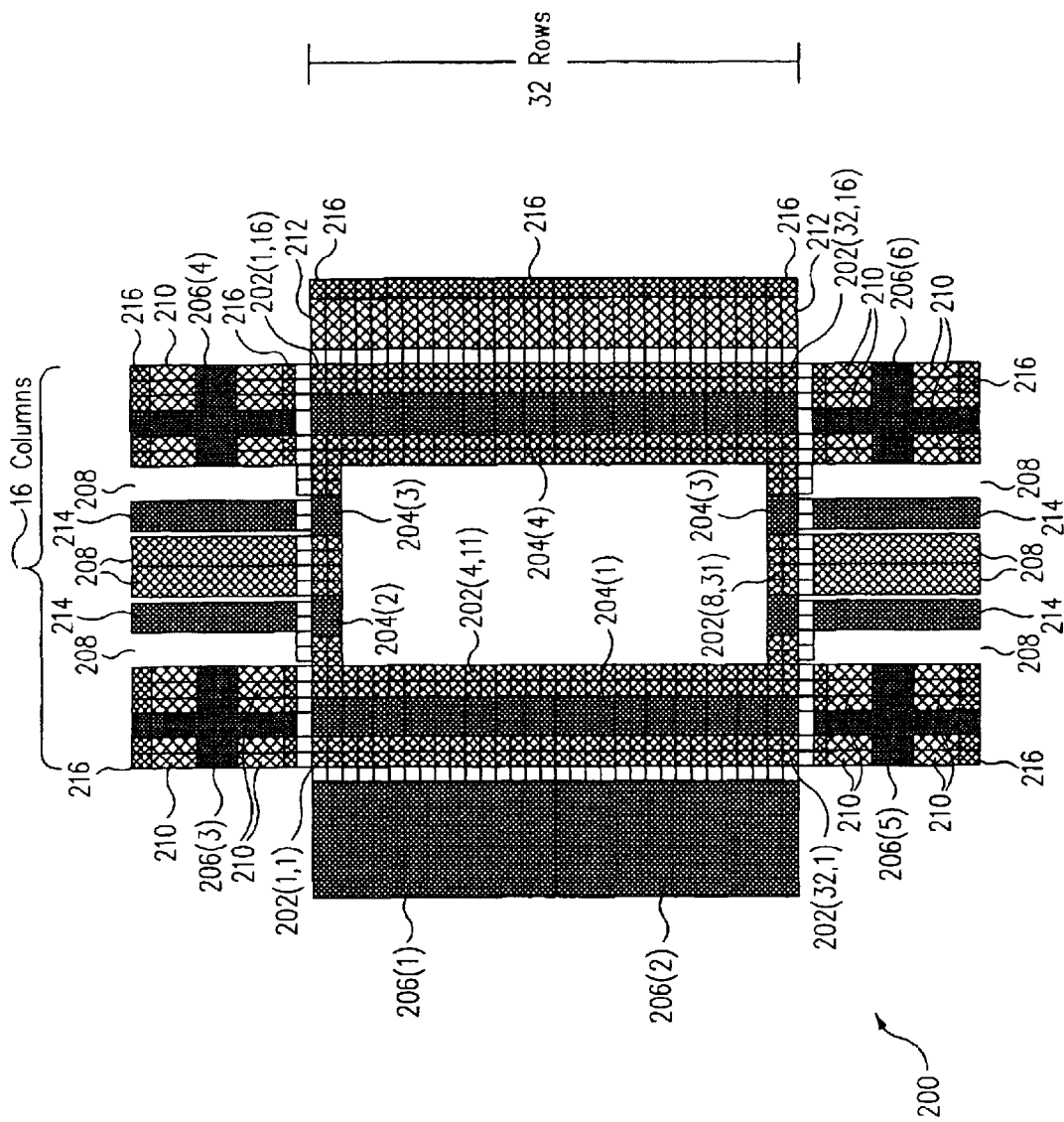
FIGS. 2 through 7 illustrate the scalability of the device architecture in accordance with an embodiment of the present invention.

For example, FIG. 8 lists the number of input/output interfaces for exemplary interface standards (e.g., XAUI, VSR Sonet, and Gbit Ethernet) that could be supported by type-1 hard-macro circuits, such as hard-macro circuits 206(1) or 206(2) of FIG. 2, for various devices (e.g., Devices A through E). The number of required type 1 hard macros is listed based on the number of lanes necessary for each input/output interface standard. Below each device of a given size (i.e., having the given number of type 1 macros), there is listed the number of input/output interfaces that the given device can support. For example, Device A can support eight input/output interfaces for the InfiniBand input/output interface standard that requires one lane or two input/output interfaces for the VSR SONET input/output interface standard that requires four lanes. The number of lanes indicates the number of parallel bits in transmit and receive data paths. For example, four lanes mean that the data path has four parallel bits in the transmit data path and four parallel bits in the receive data path.

FIG. 9 lists the number of input/output interfaces for exemplary interface standards (e.g., RapidIO, SFI-4, and DDR memory interface) that could be supported by type 2 hard macro circuits, such as hard-macro circuits 206(3), 206(4), 206(5), or 206(6) of FIG. 2, for various devices (e.g., Devices A through F). The number of required type 2 macros is listed based on the required transmit and receive paths for each input/output interface standard (if the type 2 macros are either configured as transmitters or receivers). Below each device of a given size (i.e., Devices A through F having the given number of type 2 macros), there is listed the number of input/output interfaces that the given device can support. For example, Device C can support six input/output interfaces for the HyperTransport input/output interface standard that has a data bus width of eight bits or three input/output interfaces for the Utopia-4 input/output interface standard that has a data bus width of sixteen bits (assuming each macro handles eight bits and the macros are cascaded to provide wider data widths).

Returning to FIG. 2, device 200 may also include various other exemplary circuits. For example, device 200 includes one or more global phase-locked loop (PLL) blocks 208, high-bandwidth input/output blocks 210 (e.g., high-bandwidth ASIC-type input/output circuits), a column of general-purpose input/output blocks 212 (e.g., general-purpose ASIC-type input/output blocks), source synchronous common blocks 214, and input/output pads 216. Global PLL blocks 208 include PLL blocks and other global support circuits for device 200.

High-bandwidth input/output blocks 210 support hard macro circuits 206 by serving as their corresponding input/output drivers. General-purpose input/output blocks 212 represent optional fixed input/output circuitry to support certain specific applications and are not associated with hard-macro circuits 206. Source synchronous common blocks 214 may be associated with hard-macro circuits 206 to provide common signals (e.g., clock, reset, and control signals) to aid in cascading two or more of hard-macro circuits 206 (e.g., hard-macro circuits 206(3) through 206 (6)). Source synchronous common blocks 214 may also include various circuits, such as local PLL or delay-lock loop (DLL) circuits, bias generators, and other local support circuits.

Figure 3:
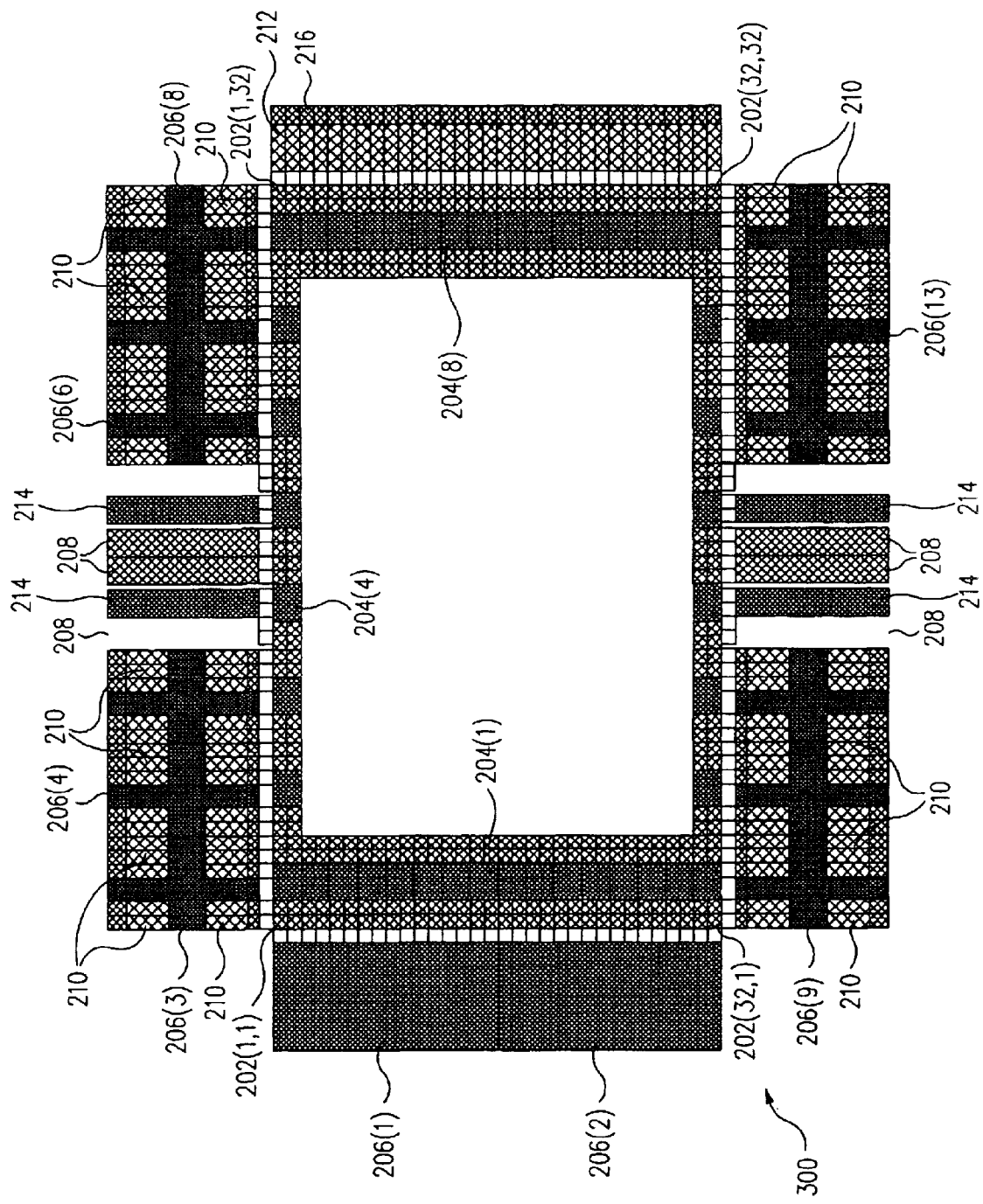
Figure 4:
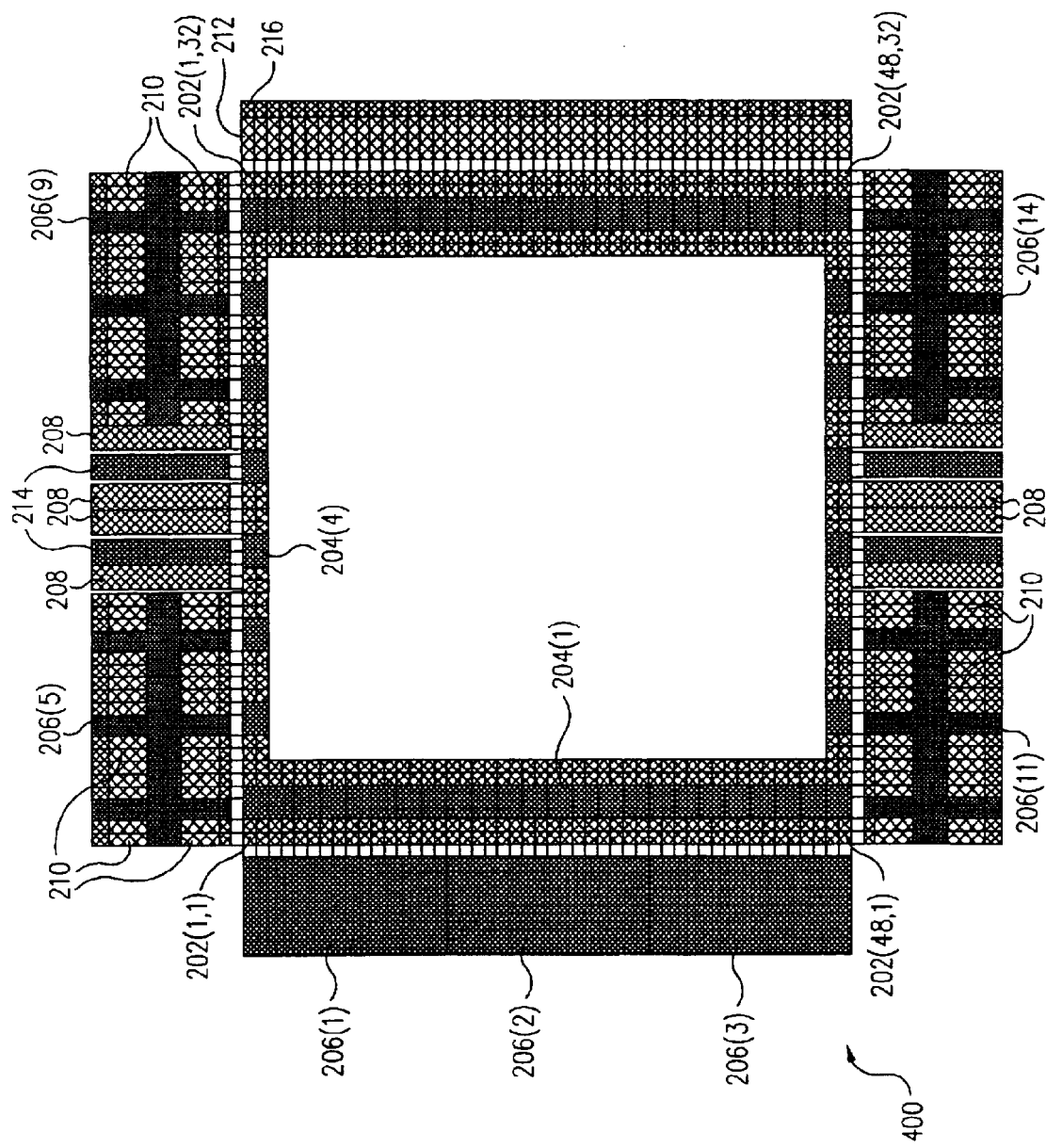

FIG. 3 shows device 300 having 32 rows and 32 columns of logic blocks 202, 8 columns of memory 204, and 14 hard-macro circuits 206. For example, hard-macro circuits 206 may include 2 type 1 hard-macro circuits 206 (e.g., hard-macro circuits 206(1) and 206(2)) and 12 type 2 hard-macro circuits 206 (e.g., hard-macro circuits 206(3) through 206(14)). FIG. 4 shows device 400 having 48 rows and 32 columns of logic blocks 202, 8 columns of memory 204, and 15 hard-macro circuits 206. For example, hard-macro circuits 206 may include 3 type 1 hard-macro circuits 206 (e.g., hard-macro circuits 206(1) through 206(3)) and 12 type 2 hard-macro circuits 206 (e.g., hard-macro circuits 206(4) through 206(15)).

Figure 5:
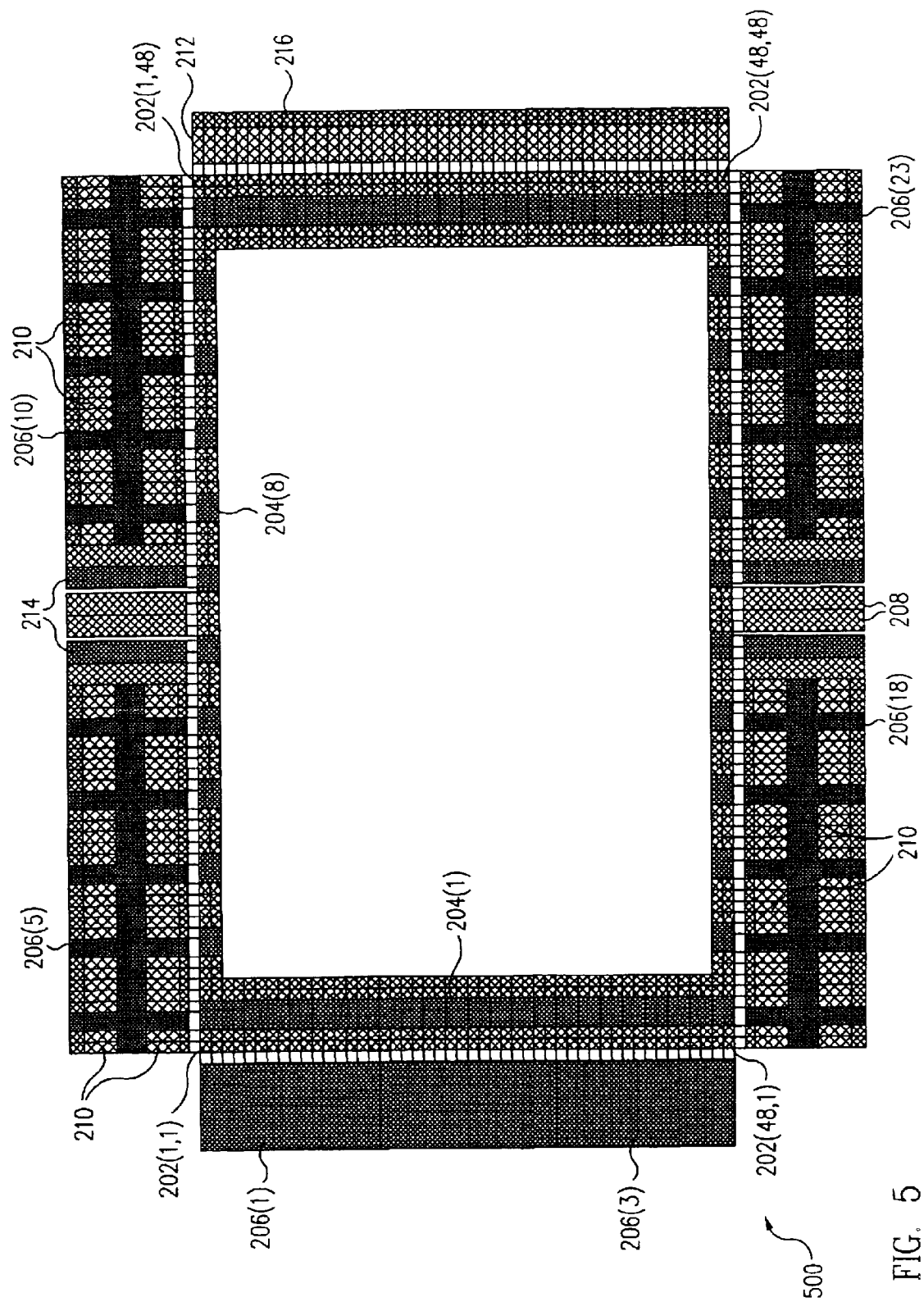
Figure 6:
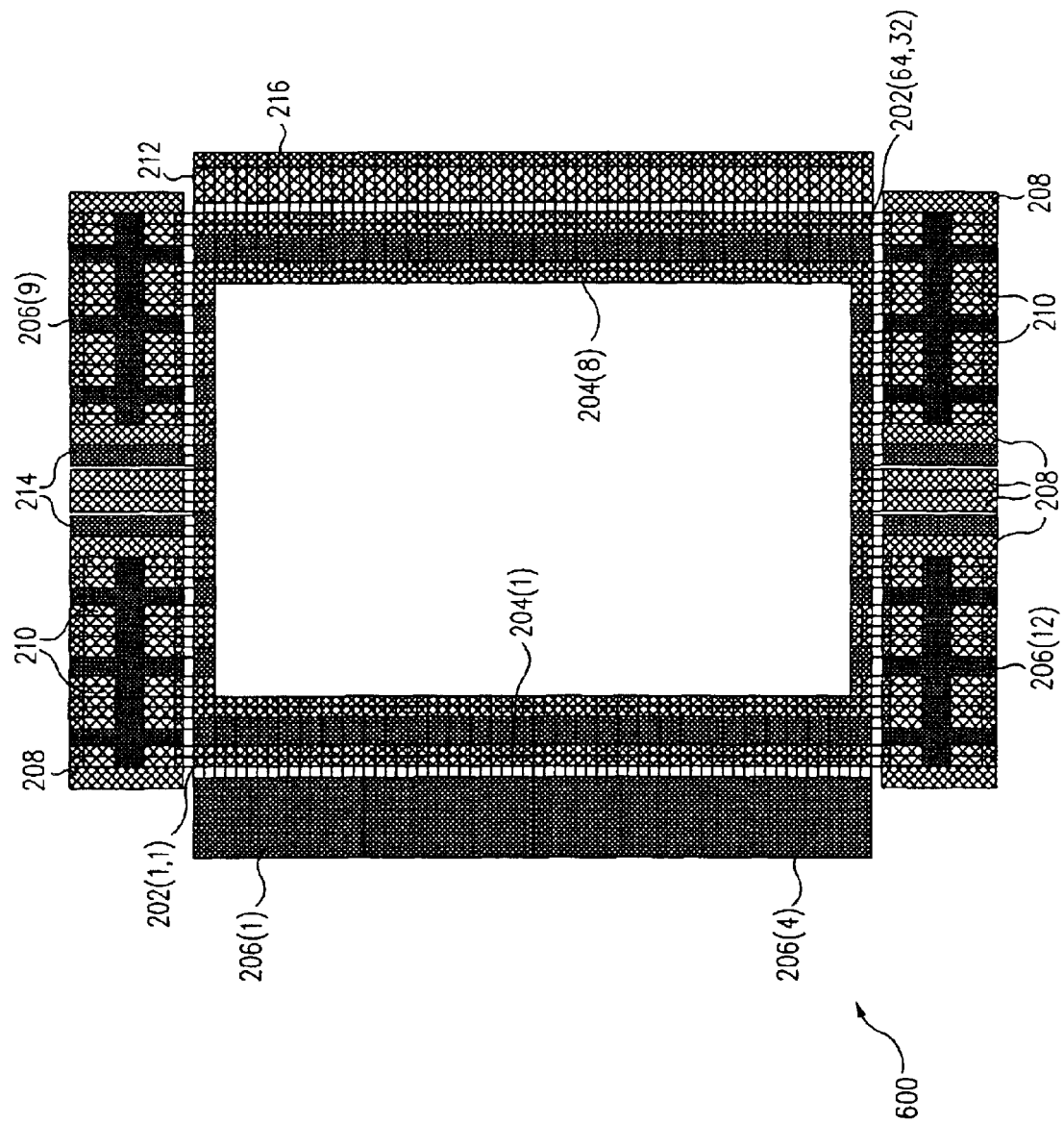

FIG. 5 shows device 500 having 48 rows and 48 columns of logic blocks 202, 12 columns of memory 204, and 23 hard-macro circuits 206. For example, hard-macro circuits 206 may include 3 type 1 hard-macro circuits 206 (e.g., hard-macro circuits 206(1) through 206(3)) and 20 type 2 hard-macro circuits 206 (e.g., hard-macro circuits 206(4) through 206(23)). FIG. 6 shows device 600 having 64 rows and 32 columns of logic blocks 202, 8 columns of memory 204, and 16 hard-macro circuits 206. For example, hard-macro circuits 206 may include 4 type 1 hard-macro circuits 206 (e.g., hard-macro circuits 206(1) through 206(4)) and 12 type 2 hard-macro circuits 206 (e.g., hard-macro circuits 206(5) through 206(16)).

Figure 7:
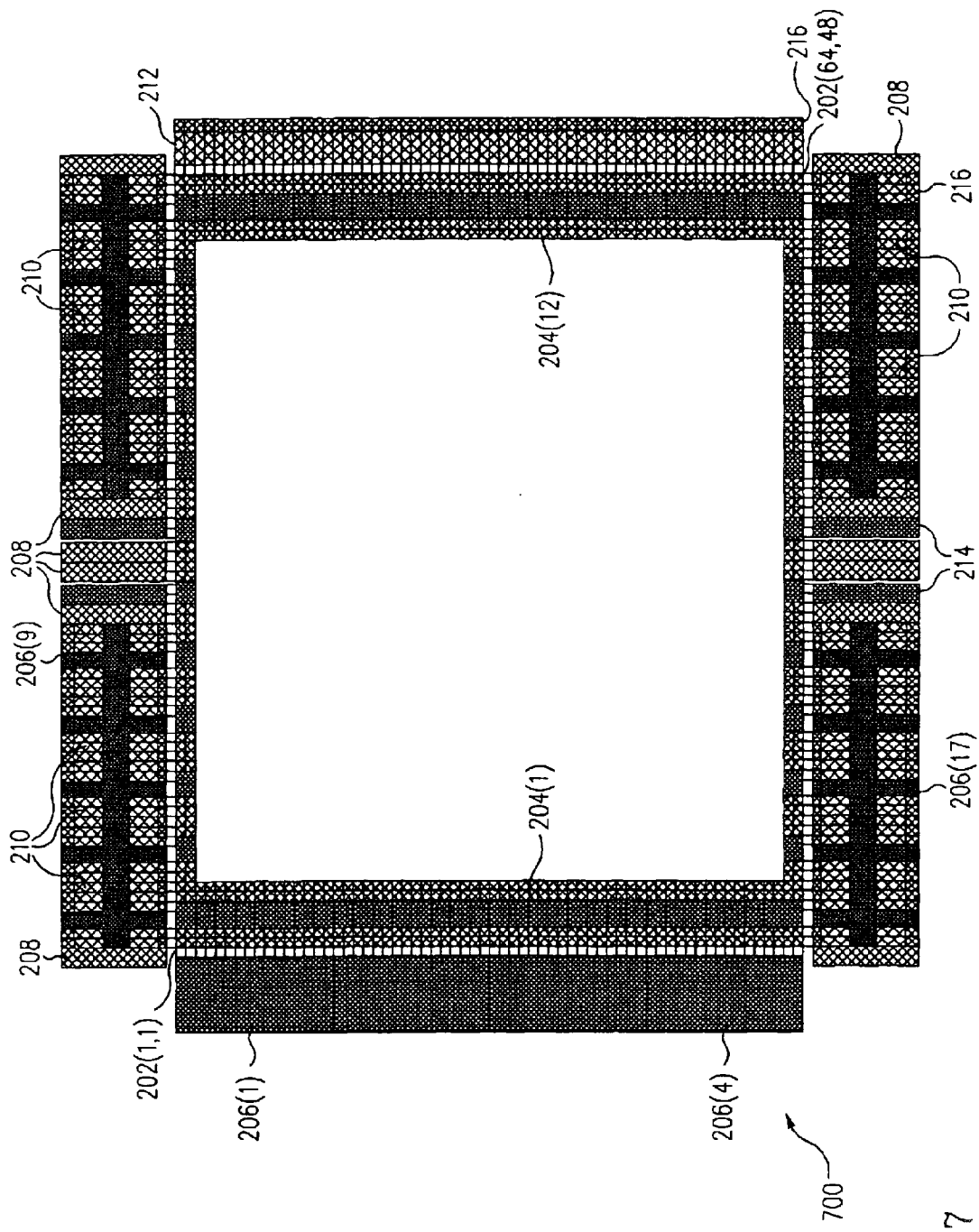

FIG. 7 shows device 700 having 64 rows and 48 columns of logic blocks 202, 12 columns of memory 204, and 24 hard-macro circuits 206. For example, hard-macro circuits 206 may include 4 type 1 hard-macro circuits 206 (e.g., hard-macro circuits 206(1) through 206(4)) and 20 type 2 hard-macro circuits 206 (e.g., hard-macro circuits 206(5) through 206(24)). Devices 300 through 700 may further include one or more global PLL blocks 208, high-bandwidth input/output blocks 210, a column of general-purpose input/output blocks 212, and source synchronous common blocks 214.

Hard-macro circuits 206 (FIGS. 2 through 7) illustrate that it is not required that they be organized as a single ring of dedicated logic or circuitry within the device, such as illustrated by device 100 (FIG. 1). Rather, the hard-macro circuits may be arranged on the device, for example, based on the most efficient layout. The hard-macro circuits may also be of one type or of different types, each of which may be independently configurable to support one or more input/output interface standards. Consequently, the hard-macro circuits allow the device to support multiple different input/output interfaces simultaneously, allowing for efficient implementation of logic or circuitry, such as for example bus-bridges and protocol switches.

As shown in FIGS. 2 through 7, for example, the SerDes/PCS macros (i.e., type 1 macros) are located at the left end of the rows while the source-synchronous macros (i.e., type 2 macros) are at the top and bottom ends of the columns. The right end of the rows is connected to general-purpose input/output circuits that are not associated with either the SerDes/PCS macros or the source-synchronous macros. The overall chip area of the SerDes/PCS macro, source-synchronous macro, and general-purpose input/output circuits may differ to such an extent that an arrangement, such as shown in FIGS. 2 through 7, where each side of the device contains only one of these items, rather than mixing and matching them, may result in the most area-efficient solution. However, this exemplary layout is not limiting and is dependent upon the input/output interface requirements of the device and the particular application.

In general, device 100 and devices 200 through 700 illustrate device architectures, in accordance with some embodiments of the present invention, which accommodate a range of device sizes. For example, the number of rows and columns, which may represent various types of logic, memory, and other circuitry, is variable. Also, the number of hard-macro circuits or input/output interface circuitry is variable and may comprise various types of hard-macro circuits, depending upon the input/output interface standards to be supported.

Furthermore, the hard-macro circuits can be cascaded to implement wide interfaces, with the cascade capability allowing the hard-macro circuits to be optionally designed for the minimum width allowed by the input/output interface standards. Therefore, smaller devices in the device family can efficiently support narrower bus widths, while larger devices can support wider bus widths by cascading the hard-macro circuits. This technique is consistent with the availability of other resources on the device, such as for example, input/output count or pins and logic blocks. Alternatively, the hard-macro circuits can be cascaded and designed with any desired data width, such as for example based on the expected input/output interface standards or intended applications.

FIG. 1 illustrates an embodiment of the present invention having the device circuitry grouped into three general categories (i.e., input/output drivers 102, hard-macro circuits 104, and core circuits 106). However, this embodiment is not limiting. For example, a device may have its circuitry grouped into four general categories, with core circuits 106 divided into two categories, a fixed portion and a programmable portion. The fixed portion represents circuitry designed to perform the devices desired function, while the programmable portion contains circuitry designed to be programmed to perform the lower-speed logic necessary for the high-speed input/output interface standards. Hard-macro circuits 104 would continue to provide the higher-speed logic necessary for the high-speed input/output interface standards. Alternatively, the programmable portion may be incorporated into hard-macro circuits 104.

Figure 10A:
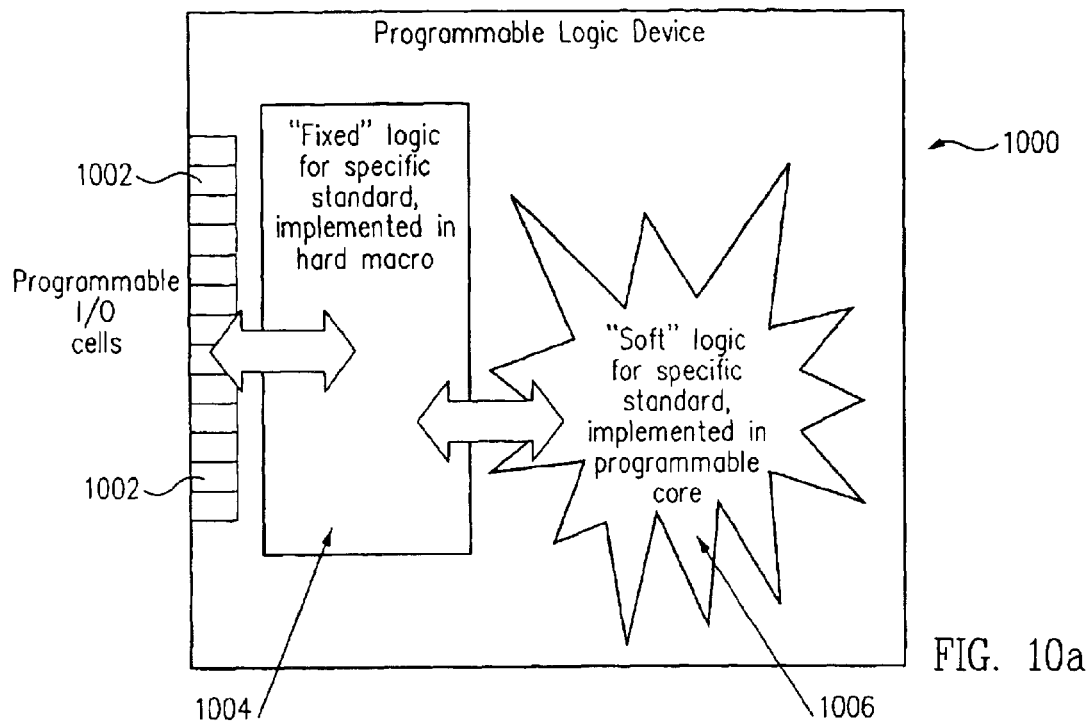
FIGS. 10a and 10b illustrate an architecture technique for a device in accordance with an embodiment of the present invention.
Figure 10B:
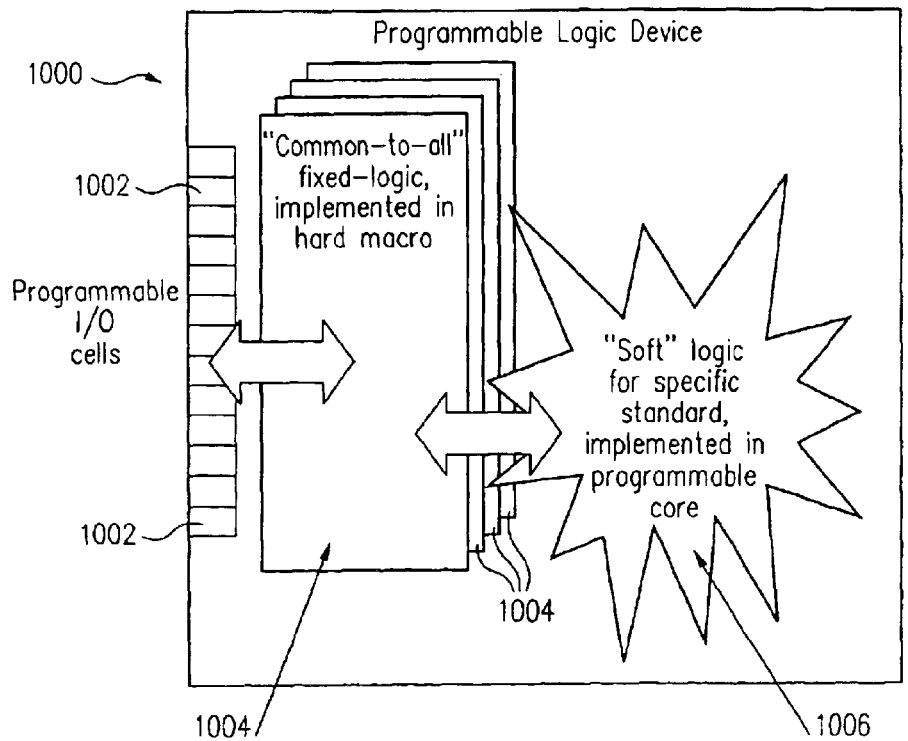

FIGS. 10a and 10b illustrate an architecture technique for a device 1000 in accordance with an embodiment of the present invention. Device 1000 represents any type of electrical device (e.g., an integrated circuit or chip) that requires a high-speed input/output interface. For example, device 1000 is a programmable logic device, such as a complex programmable logic device or a field programmable gate array. Device 1000 includes input/output drivers 1002, input/output circuits 1004, and programmable circuits 1006.

Input/output drivers 1002 receive information (e.g., data) from an interface (not shown) between device 1000 and external circuitry (e.g., other systems or devices) and provide this data to input/output circuits 1004. Input/output drivers 1002 also transmit data received from input/output circuits 1004 to the interface, which provides the information to external devices. The interface may be any type of electrical or other type of communication interface (e.g., wired or wireless). For example, the interface may comprise wires or traces for transferring the electrical signals between device 1000 and external circuitry (e.g., a chip-to-chip interface).

Input/output drivers 1002 are, for example, programmable input/output drivers or cells that can support a wide range of electrical signaling levels required for the standard interfaces. Exemplary types of electrical signaling levels include LVCMOS, SSTL, HSTL, and LVDS, but these are not limiting and many other types of signaling levels may be supported, such as those discussed herein for various embodiments (e.g., in reference to FIGS. 1, 8, and 9).

Input/output circuits 1004 receive the data from and provide data to input/output drivers 1002, with input/output circuits 1004 ultimately providing data or information to programmable circuits 1006, as illustrated in FIG. 10a. Input/output circuits 1004 are circuits that may be viewed as "fixed" logic and implemented as hard-macro circuits (situated between input/output drivers 1002 and programmable circuits 1006), which are optimized for performance to support one or more of the high-speed input/output interface standards. The term hard-macro refers to building blocks, cells, or logic, for example, that collectively perform an intended function or application. Input/output circuits 1004 are, for example, equivalent to hard-macro circuits 104 (discussed in reference to FIG. 1) or hard-macro circuits 206 (discussed in reference to FIGS. 2 through 7).

Programmable circuits 1006 may include the programmable core logic of device 1000, such as for example, logic blocks, lookup tables, macro cells, and/or other types of programmable circuitry that may be found on conventional programmable logic devices. Alternatively, programmable circuits 1006 may be separate from the programmable core logic of device 1000 and represent programmable circuitry that may be part of input/output circuits 1004 or separate from input/output circuits 1004 and the programmable core logic of device 1000.

Programmable circuits 1006 may be viewed as "soft" logic that is optimized for flexibility to provide the logic necessary to complete the logic requirements of one or more of the supported high-speed input/output interface standards. For example, programmable circuits 1006 may be utilized to perform the lower-speed logic (e.g., interface controllers, FIFO buffers, and state machines) that does not require the high-speed circuitry of input/output circuits 1004.

In general, FIG. 10a illustrates a technique in accordance with an embodiment of the present invention for a programmable logic device to support one or more high-speed input/output interface standards. Each of the high-speed input/output interface standards is decomposed into a high-speed fixed-logic portion dedicated to that standard and a lower-speed soft-logic portion. The high-speed fixed-logic portion is supported by input/output circuits 1004, while the lower-speed soft-logic portion is supported by programmable circuits 1006 (e.g., the programmable core logic of device 1000) that is programmed to meet the remaining requirements of the high-speed input/output interface standard. Alternatively in accordance with an embodiment of the present invention, for input/output interface standards that do not require high-speed performance, input/output circuits 1004 can be bypassed and the requirements of the input/output interface standard supported by programmable circuits 1006.

FIG. 10b shows a block diagram illustrating device 1000 in accordance with an embodiment of the present invention. Device 1000 illustrates how one input/output circuit 1004 can support a number of input/output interface standards by performing the common features of the input/output interface standards. For example, each input/output circuit 1004 may support more than one type of input/output interface standard (i.e., fixed-logic common-to-all input/output interface standards).

Device 1000 in FIG. 10b also illustrates how input/output circuits 1004 can be expanded or scaled to accommodate a large number of potentially different high-speed input/output interface standards. By incorporating additional input/output circuits 1004 on device 1000, a larger number of input/output interfaces can be supported. Also, input/output circuits 1004 can be cascaded to support wider data widths for the input/output interface standards. Furthermore, one or more of input/output circuits 1004 may differ from each other or be of a different type of hard-macro, as discussed herein, to support different types or groups of the input/output interface standards.

For device 1000, the connection or electrical coupling between input/output drivers 1002 and input/output circuits 1004 must support the performance requirements that are required by the desired high-speed input/output interface standards (i.e., protocols). The connection or electrical coupling between input/output circuits 1004 and programmable circuits 1006 must support at least the performance that is available from programmable circuits 1006.

FIGS. 10a and 10b illustrate a technique in accordance with some embodiments of the present invention that recognizes and extracts the commonality between the numerous input/output interface standards and implements this in a device as a combination of fixed and programmable circuitry. The common, high-speed portion of the input/output interface standards is extracted and implemented in a configurable "fixed" circuit (e.g., input/output circuits 1004) that is optimized for the high-speed requirements. The application-specific, lower-speed portion of the input/output interface standards (e.g., interface controllers, protocol state machines, and buffering) is extracted and implemented in programmable circuitry (e.g., programmable circuits 1006).

By recognizing and extracting the underlying commonality between the standards (implemented in input/output circuits 1004) and dealing with the difference between them in programmable circuits 1006 (e.g., the programmable core logic of the device), a single hard-macro or a limited number of hard-macros can be developed that address a large number of input/output interface standards and protocols. This solves the problems inherent in a scheme that has one separate hard-macro for each input/output interface standard and no reliable method to predict what mixture of such macros should be included on a general purpose programmable device.

As an example, FIG. 11 shows a table that illustrates an exemplary list of common features for source-synchronous interface standards in accordance with an embodiment of the present invention. Specifically, the table lists an exemplary (but not limiting) number of source-synchronous standards along with an exemplary set of common features that may be extracted and implemented in the configurable hard macros (e.g., hard macro circuits of FIG. 1). Thus, the table columns illustrate examples of commonality among the listed standards that may be exploited by the hard macros.

Consequently, the hard macro can be designed with only a limited number of configurable options (e.g., electrical signaling, clocking style, clock shift, and gearbox ratio) to address the high-speed portion of the source-synchronous standards, while the remaining lower-speed portion of the source-synchronous standards is implemented in the programmable core logic of the device.

Note that the receiver gearbox column and the transmitter gearbox column are exemplary for a given interface rate and a given core rate of the device. Consequently, the gearbox settings will differ depending upon the data rate required by the supported interface standards and the maximum data rate of the core logic of the programmable logic device.

As another example, FIG. 12 shows a table that illustrates an exemplary list of common features for clock and data recovery-based interface standards (SerDes based standards) in accordance with an embodiment of the present invention. Specifically, the table lists an exemplary (but not limiting) number of SerDes Based standards along with an exemplary set of common features that may be extracted and implemented in the configurable hard macros (e.g., hard macro circuits of FIG. 1). Thus, the table columns illustrate examples of commonality among the listed standards that may be exploited by the hard macros.

Consequently, the hard macro can be designed with only a limited number of programmable options (e.g., electrical signaling, sync character detect, 8b/10b encoder/decoder, clock tolerance compensation, channel alignment, deskew state machine, synchronization state machine, and transmit and receive state machines) to address the high-speed portion of the SerDes-based standards, while the remaining lower-speed portion of the SerDes-based standards is implemented in programmable core logic of the device. Thus, a programmable logic device having a hard macro to support SerDes-based standards and/or a hard macro to support source/system-synchronous standards, allows a programmable logic device, having a relatively slow core logic clock rate, to support high-speed interface standards. The core logic may be utilized to implement the lower-speed requirements of the interface standards.

Embodiments described above illustrate but do not limit the invention. It should also be understood that numerous modifications and variations are possible in accordance with the principles of the present invention. Accordingly, the scope of the invention is defined only by the following claims.

We claim:

1. A programmable device comprising:

a plurality of programmable input/output drivers;

a plurality of hard macros coupled to the programmable input/output drivers, with each of the hard macros configurable to support more than one input/output interface standard; and programmable core logic coupled to the hard macros.

2. The device of claim 1, wherein high-speed functions for the input/output interface standards are supported by the hard macros and the remaining lower-speed functions required for the input/output interface standards are supported by the programmable core logic.

3. The device of claim 1, wherein a first set of the plurality of hard macros is adaptable to support the input/output interface standards requiring clock and data recovery circuits and a second set of the plurality of hard macros is adaptable to support the input/output interface standards requiring source-synchronous and/or system-synchronous clocks.

4. The device of claim 1, wherein the programmable input/output drivers are further coupled to the programmable core logic, allowing at least one of the hard macros to be bypassed if the performance available from the programmable core logic meets the performance requirements of the input/output interface standard.

5. The device of claim 1, wherein the hard macros are adaptable to be cascaded to provide wider data paths for the input/output interface standards.

6. The device of claim 1, wherein the coupling between the programmable input/output drivers and the hard macros at least meets the data rate requirements of the input/output interface standards and the coupling between the hard macros and the programmable core logic meets at least the performance available from the programmable core logic.

7. The device of claim 1, wherein the programmable input/output drivers are adaptable to support a range of electrical signaling levels.

8. A method for supporting a plurality of input/output interface standards with a programmable device, the method comprising:

supporting a plurality of electrical signaling levels;

determining the common high-speed requirements of the input/output interface standards; and mapping the common high-speed requirements of the input/output interface standards to hard macros on the programmable device, with each of the hard macros configurable to implement more than one input/output interface standard.

9. The method of claim 8, further comprising supporting the implementation of at least a portion of the lower-speed requirements of the input/output interface standards with programmable core circuits of the programmable device.

10. The method of claim 9, further comprising bypassing the hard macros when the performance available from the programmable core circuits meets the requirements of the input/output interface standards.

11. The method of claim 8, further comprising cascading the hard macros to support wider data widths.

12. The method of claim 8, wherein the mapping of the high-speed requirements further comprises mapping the input/output interface standards requiring clock and data recovery circuits to a first set of the hard macros and mapping the input/output interface standards requiring source-synchronous or system-synchronous standards to a second set of the hard macros.

13. A method of implementing a plurality of input/output interface standards on a programmable device, the method comprising:

determining common characteristics for a plurality of input/output interface standards;

providing configurable hard-macro circuits to implement the common characteristics, with each of the hard-macro circuits adaptable to support more than one of the input/output interface standards; and providing programmable core circuits for implementing the remaining requirements for the input/output interface standards in the programmable logic device.

14. The method of claim 13, wherein the determining of the common characteristics further comprises determining a first set of common characteristics for a first set of the plurality of input/output interface standards utilizing clock and data recovery standards and determining a second set of common characteristics for a second set of the plurality of input/output interface standards utilizing source-synchronous standards and/or system-synchronous standards.

15. The method of claim 13, further comprising bypassing the hard-macro circuits if the programmable core circuits meet the requirements of the input/output interface standard.

16. The method of claim 13, further comprising cascading the hard-macro circuits to support wider data widths.

17. A programmable device comprising:

a plurality of input/output drivers;

a plurality of hard macros coupled to the input/output drivers, with each of the hard macros adapted to support more than one input/output interface standard; and programmable core logic coupled to the hard macros, wherein common functions for the input/output interface standards are supported by the hard macros and specific functions required for the input/output interface standards are supported by the programmable core logic.

18. The programmable device of claim 17, wherein the input/output drivers are programmable.

19. The programmable device of claim 17, wherein the hard macros are configurable to support multiple input/output interface standards.

20. The programmable device of claim 17, wherein the common functions correspond to high-speed functions of the input/output interface standards and the specific functions correspond to lower-speed functions of the input/output interface standards.

* * * * *